United States Patent
Yang et al.

(10) Patent No.: US 10,133,664 B2
(45) Date of Patent: Nov. 20, 2018

(54) METHOD, FLASH MEMORY CONTROLLER, MEMORY DEVICE FOR ACCESSING 3D FLASH MEMORY HAVING MULTIPLE MEMORY CHIPS

(71) Applicant: Silicon Motion Inc., Hsinchu County (TW)

(72) Inventors: Tsung-Chieh Yang, Hsinchu (TW); Hong-Jung Hsu, Kaosiung (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/497,217

(22) Filed: Apr. 26, 2017

(65) Prior Publication Data

US 2017/0315909 A1 Nov. 2, 2017

Related U.S. Application Data

(60) Provisional application No. 62/328,025, filed on Apr. 27, 2016, provisional application No. 62/328,027, filed on Apr. 27, 2016.

(30) Foreign Application Priority Data

Jan. 3, 2017 (TW) .............................. 106100010 A

(51) Int. Cl.
| | |
|---|---|
| G06F 12/02 | (2006.01) |
| G06F 3/06 | (2006.01) |
| G06F 11/10 | (2006.01) |
| G11C 7/10 | (2006.01) |
| G11C 11/56 | (2006.01) |

(Continued)

(52) U.S. Cl.
CPC ........ *G06F 12/0246* (2013.01); *G06F 3/0679* (2013.01); *G06F 11/1072* (2013.01); *G11C 7/1006* (2013.01); *G11C 11/5628* (2013.01); *G11C 11/5642* (2013.01); *G11C 16/0483* (2013.01); *G11C 16/08* (2013.01); *G11C 16/10* (2013.01); *G11C 16/26* (2013.01); *G11C 29/52* (2013.01); *G11C 2211/5641* (2013.01)

(58) Field of Classification Search
CPC ........ G06F 3/0619; G11C 29/42; G11C 29/52
See application file for complete search history.

(56) References Cited

U.S. PATENT DOCUMENTS

| 6,903,972 B2 | 6/2005 | Lasser |
|---|---|---|
| 7,710,777 B1 | 5/2010 | Montierth |

(Continued)

FOREIGN PATENT DOCUMENTS

| TW | M369528 U1 | 11/2009 |
|---|---|---|
| TW | 201535114 A | 9/2015 |

(Continued)

*Primary Examiner* — Vanthu Nguyen
(74) *Attorney, Agent, or Firm* — Winston Hsu

(57) ABSTRACT

A method for accessing a flash memory module is provide. The flash memory module is a 3D flash memory module including a plurality of flash memory chips, each flash memory chip includes a plurality of blocks, each block includes a plurality of pages, and the method includes: configuring the flash memory chips to set at least one super block of the flash memory chips; and allocating a buffer memory space to store a plurality of temporary parities generated when data is written into the at least one first super block.

15 Claims, 11 Drawing Sheets

(51) Int. Cl.
 *G11C 16/04* (2006.01)
 *G11C 16/10* (2006.01)
 *G11C 16/26* (2006.01)
 *G11C 29/52* (2006.01)
 *G11C 16/08* (2006.01)

(56) References Cited

U.S. PATENT DOCUMENTS

| | | | |
|---|---|---|---|
| 8,327,066 B2 | 12/2012 | Heo | |
| 8,792,277 B2 | 7/2014 | Eggleston | |
| 8,892,981 B2 | 11/2014 | Post | |
| 8,972,776 B2 * | 3/2015 | Baryudin | G06F 12/02 711/103 |
| 9,286,985 B2 | 3/2016 | Kimura | |
| 9,685,242 B2 | 6/2017 | Sugiyama | |
| 9,734,911 B2 | 8/2017 | Sinclair | |
| 9,767,913 B2 | 9/2017 | Nagashima | |
| 2006/0050314 A1 | 3/2006 | Shiga | |
| 2008/0244356 A1 | 10/2008 | Bliss | |
| 2010/0259983 A1 | 10/2010 | Yoon | |
| 2010/0332922 A1 | 12/2010 | Chang | |
| 2011/0283166 A1 | 11/2011 | Kim | |
| 2011/0283167 A1 | 11/2011 | Bliss | |
| 2012/0173920 A1 | 7/2012 | Park | |
| 2012/0213005 A1 | 8/2012 | Lee | |
| 2012/0246540 A1 | 9/2012 | Lee | |
| 2013/0117620 A1 | 5/2013 | Joo | |
| 2013/0297984 A1 * | 11/2013 | Yamaga | G06F 11/1012 714/755 |
| 2013/0322171 A1 | 12/2013 | Lee | |
| 2014/0068319 A1 | 3/2014 | Daly | |
| 2014/0101372 A1 | 4/2014 | Jung | |
| 2014/0129874 A1 | 5/2014 | Zaltsman | |
| 2014/0149828 A1 | 5/2014 | Chang | |
| 2014/0185376 A1 | 7/2014 | Sinclair | |
| 2014/0226400 A1 | 8/2014 | Kimura | |
| 2014/0245105 A1 | 8/2014 | Chung | |
| 2014/0325124 A1 | 10/2014 | Antonakopoulos | |
| 2015/0058661 A1 | 2/2015 | Yang | |
| 2015/0058699 A1 | 2/2015 | Yang | |
| 2015/0058700 A1 | 2/2015 | Yang | |
| 2015/0067439 A1 | 3/2015 | Yamaki | |
| 2015/0169402 A1 | 6/2015 | Wu | |
| 2015/0178149 A1 | 6/2015 | Cai | |
| 2015/0248328 A1 | 9/2015 | Yoon | |
| 2015/0293713 A1 | 10/2015 | Seo | |
| 2015/0347229 A1 | 12/2015 | Higgins | |
| 2016/0062829 A1 | 3/2016 | Harasawa | |
| 2016/0104539 A1 | 4/2016 | Kim | |
| 2016/0110102 A1 | 4/2016 | Lee | |
| 2016/0110249 A1 | 4/2016 | Orme | |
| 2016/0260489 A1 | 9/2016 | Lee | |
| 2016/0306553 A1 | 10/2016 | Ellis | |
| 2016/0313931 A1 | 10/2016 | Song | |
| 2016/0342345 A1 | 11/2016 | Kankani | |
| 2017/0031751 A1 * | 2/2017 | Baek | G06F 3/0688 |
| 2017/0046225 A1 * | 2/2017 | Yang | G11C 7/1006 |
| 2017/0060425 A1 | 3/2017 | Sunata | |
| 2017/0317693 A1 | 11/2017 | Yang | |
| 2018/0018091 A1 | 1/2018 | Shin | |

FOREIGN PATENT DOCUMENTS

| | | |
|---|---|---|
| TW | 201603047 A | 1/2016 |
| TW | 201612908 A | 4/2016 |

* cited by examiner

|  | Data page address | | | |
|---|---|---|---|---|
| WL_G0 (WL0~WL3) { Lower data page | P0L | P1L | P2L | P3L |
| Middle data page | P0M | P1M | P2M | P3M |
| Upper data page | P0U | P1U | P2U | P3U |
| WL_G1 (WL4~WL7) { Lower data page | P4L | P5L | P6L | P7L |
| Middle data page | P4M | P5M | P6M | P7M |
| Upper data page | P4U | P5U | P6U | P7U |

⋮

| WL_G47 { Lower data page | P188L | P189L | P190L | P191L |
|---|---|---|---|---|
| Middle data page | P188M | P189M | P190M | P191M |
| Upper data page | P188U | P189U | P190U | P191U |

FIG. 4

| | | Chip 512 | Chip 514 | Chip 522 | Chip 524 | Parity check codes |
|---|---|---|---|---|---|---|
| WL_G0 | WL0 | P0 | P0 | P0 | P0 | S0 |
| | WL1 | P1 | P1 | P1 | P1 | S1 |
| | WL2 | P2 | P2 | P2 | P2 | S2 |
| | WL3 | P3 | P3 | P3 | P3 | S3 |
| WL_G1 | WL4 | P4 | P4 | P4 | P4 | S4 |
| | WL5 | P5 | P5 | P5 | P5 | S5 |
| | WL6 | P6 | P6 | P6 | P6 | S6 |
| | WL7 | P7 | P7 | P7 | P7 | S7 |
| WL_G2 | WL8 | P8 | P8 | P8 | P8 | S8 |
| | WL9 | P9 | P9 | P9 | P9 | S9 |
| | WL10 | P10 | P10 | P10 | P10 | S10 |
| | WL11 | P11 | P11 | P11 | P11 | S11 |
| WL_G3 | WL12 | P12 | P12 | P12 | P12 | S12 |
| | WL13 | P13 | P13 | P13 | P13 | S13 |
| | WL14 | P14 | P14 | P14 | P14 | S14 |
| | WL15 | P15 | P15 | P15 | P15 | S15 |
| WL_G4 | WL16 | P16 | P16 | P16 | P16 | S16 |
| | WL17 | P17 | P17 | P17 | P17 | S17 |
| | WL18 | P18 | P18 | P18 | P18 | S18 |
| | WL19 | P19 | P19 | P19 | P19 | S19 |
| WL_G46 | WL184 | P184 | P184 | P184 | P184 | S184 |
| | WL185 | P185 | P185 | P185 | P185 | S185 |
| | WL186 | P186 | P186 | P186 | P186 | S186 |
| | WL187 | P187 | P187 | P187 | P187 | S187 |
| WL_G47 | WL188 | P188 | P188 | P188 | P188 | S188 |
| | WL189 | P189 | P189 | P189 | P189 | S189 |
| | WL190 | P190 | P190 | P190 | P190 | S190 |
| | WL191 | P191 | P191 | P191 | P191 | S191 |

FIG. 6

S0L, S8L, S16L, ......, S184L    XOR
S0M, S8M, S16M, ...., S184M   XOR  ⟶ SF0 ⟶ P184
S0U, S8U, S16U, ......, S184U    XOR

S1L, S9L, S17L, ......, S185L    XOR
S1M, S9M, S17M, ...., S185M   XOR  ⟶ SF1 ⟶ P185
S1U, S9U, S17U, ......, S185U    XOR

S2L, S10L, S18L, ......, S186L    XOR
S2M, S10M, S18M, ...., S186M   XOR  ⟶ SF2 ⟶ P186
S2U, S10U, S18U, ......, S186U    XOR

S3L, S11L, S19L, ......, S187L    XOR
S3M, S11M, S19M, ...., S187M   XOR  ⟶ SF3 ⟶ P187
S3U, S11U, S19U, ......, S187U    XOR

⋮   ⋮   ⋮   ⋮

S6L, S14L, S22L, ......, S190L    XOR
S6M, S14M, S22M, ...., S190M   XOR  ⟶ SF6 ⟶ P190
S6U, S14U, S22U, ......, S190U    XOR

S7L, S15L, S23L, ......, S191L    XOR
S7M, S15M, S23M, ...., S191M   XOR  ⟶ SF7 ⟶ P191
S7U, S15U, S23U, ......, S191U    XOR

Chip 524

| | | Chip 512 | | Chip 514 | | Chip 522 | | Chip 524 | | Parity check codes |
|---|---|---|---|---|---|---|---|---|---|---|
| | | Plane 0 | Plane 1 | Plane 0 | Plane 1 | Plane 0 | Plane 1 | Plane 0 | Plane 1 | |
| WL_G0 | WL0 | P0 | P0 | P0 | P0 | P0 | P0 | P0 | P0 | S0 |
| | WL1 | P1 | P1 | P1 | P1 | P1 | P1 | P1 | P1 | S1 |
| | WL2 | P2 | P2 | P2 | P2 | P2 | P2 | P2 | P2 | S2 |
| | WL3 | P3 | P3 | P3 | P3 | P3 | P3 | P3 | P3 | S3 |
| WL_G1 | WL4 | P4 | P4 | P4 | P4 | P4 | P4 | P4 | P4 | S4 |
| | WL5 | P5 | P5 | P5 | P5 | P5 | P5 | P5 | P5 | S5 |
| | WL6 | P6 | P6 | P6 | P6 | P6 | P6 | P6 | P6 | S6 |
| | WL7 | P7 | P7 | P7 | P7 | P7 | P7 | P7 | P7 | S7 |
| WL_G2 | WL8 | P8 | P8 | P8 | P8 | P8 | P8 | P8 | P8 | S8 |
| | WL9 | P9 | P9 | P9 | P9 | P9 | P9 | P9 | P9 | S9 |
| | WL10 | P10 | P10 | P10 | P10 | P10 | P10 | P10 | P10 | S10 |
| | WL11 | P11 | P11 | P11 | P11 | P11 | P11 | P11 | P11 | S11 |
| WL_G3 | WL12 | P12 | P12 | P12 | P12 | P12 | P12 | P12 | P12 | S12 |
| | WL13 | P13 | P13 | P13 | P13 | P13 | P13 | P13 | P13 | S13 |
| | WL14 | P14 | P14 | P14 | P14 | P14 | P14 | P14 | P14 | S14 |
| | WL15 | P15 | P15 | P15 | P15 | P15 | P15 | P15 | P15 | S15 |
| WL_G4 | WL16 | P16 | P16 | P16 | P16 | P16 | P16 | P16 | P16 | S16 |
| | WL17 | P17 | P17 | P17 | P17 | P17 | P17 | P17 | P17 | S17 |
| | WL18 | P18 | P18 | P18 | P18 | P18 | P18 | P18 | P18 | S18 |
| | WL19 | P19 | P19 | P19 | P19 | P19 | P19 | P19 | P19 | S19 |
| ⋮ | ⋮ | ⋮ | ⋮ | ⋮ | ⋮ | ⋮ | ⋮ | ⋮ | ⋮ | ⋮ |
| WL_G46 | WL184 | P184 | P184 | P184 | P184 | P184 | P184 | P184 | P184 | S184 |
| | WL185 | P185 | P185 | P185 | P185 | P185 | P185 | P185 | P185 | S185 |
| | WL186 | P186 | P186 | P186 | P186 | P186 | P186 | P186 | P186 | S186 |
| | WL187 | P187 | P187 | P187 | P187 | P187 | P187 | P187 | P187 | S187 |
| WL_G47 | WL188 | P188 | P188 | P188 | P188 | P188 | P188 | P188 | P188 | S188 |
| | WL189 | P189 | P189 | P189 | P189 | P189 | P189 | P189 | P189 | S189 |
| | WL190 | P190 | P190 | P190 | P190 | P190 | P190 | P190 | P190 | S190 |
| | WL191 | P191 | P191 | P191 | P191 | P191 | P191 | P191 | P191 | S191 |

Chip 524
Plane 1

S0L, S8L, S16L, ......, S184L    XOR
S0M, S8M, S16M, ...., S184M   XOR   → SF0 →   P184
S0U, S8U, S16U, ......, S184U    XOR

S1L, S9L, S17L, ......, S185L    XOR
S1M, S9M, S17M, ...., S185M   XOR   → SF1 →   P185
S1U, S9U, S17U, ......, S185U    XOR

S2L, S10L, S18L, ......, S186L   XOR
S2M, S10M, S18M, ...., S186M  XOR   → SF2 →   P186
S2U, S10U, S18U, ......, S186U   XOR

S3L, S11L, S19L, ......, S187L   XOR
S3M, S11M, S19M, ...., S187M  XOR   → SF3 →   P187
S3U, S11U, S19U, ......, S187U   XOR

⋮            ⋮          ⋮          ⋮

S6L, S14L, S22L, ......, S190L   XOR
S6M, S14M, S22M, ...., S190M  XOR   → SF6 →   P190
S6U, S14U, S22U, ......, S190U   XOR

S7L, S15L, S23L, ......, S191L   XOR
S7M, S15M, S23M, ...., S191M  XOR   → SF7 →   P191
S7U, S15U, S23U, ......, S191U   XOR

METHOD, FLASH MEMORY CONTROLLER, MEMORY DEVICE FOR ACCESSING 3D FLASH MEMORY HAVING MULTIPLE MEMORY CHIPS

CROSS REFERENCE TO RELATED APPLICATIONS

This application claims priority of U.S. provisional application Ser. No. 62/328,025 filed on Apr. 27, 2016 and priority of U.S. provisional application Ser. No. 62/328,027 filed on Apr. 27, 2016, which are entirely incorporated herein by reference.

BACKGROUND OF THE INVENTION

1. Field of the Invention

The present invention relates to a flash memory, and more particularly to a method for accessing a flash memory module, a corresponding flash memory controller, and a memory device.

2. Description of the Prior Art

In order to make a flash memory with higher storage density and more capacity, the 3D flash memory manufacture becomes more important, and a variety of 3D NAND-type flash memory manufactures have been developed. For a conventional 3D NAND-type flash memory, since the manufacture structure becomes totally different and positions of floating gates are changed, it becomes more complicated for data writing and reading compared to a traditional 2D NAND-type flash memory, and thus some serious problems arise. For example, for a certain 3D NAND-type flash memories, multiple word lines may be defined as one word line set, and such word lines within the same word line set share the same control circuit. This inevitably causes that data errors also occur at floating gate transistors on the other word lines within a word line set if program fail occurs at floating gate transistors on one word line of the same word line set. In addition, data errors also occur at floating gate transistors on the other word lines within a word line set if one word line is open or two word lines are short for the same word line set. Accordingly, it is important to provide an effective error correction mechanism to maintain data integrity and accuracy as well as achieving the advantage of lower circuit costs.

SUMMARY OF THE INVENTION

Therefore one of the objectives of the present invention is to provide a method for accessing a flash memory module, a corresponding flash memory controller, and a memory device. The method employs RAID-like (Redundant Array of Independent Disks-like) error correction mechanism without occupying more flash memory space and merely with less buffer memory space, to solve the problems mentioned above.

According to one embodiment of the present invention, a method for accessing a flash memory module is provided. The flash memory module is a 3D NAND-type flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines, and floating transistors on each bit line form at least one page among the plurality of data pages. The method comprises: performing encoding upon data to generate at least one set of parity check codes, wherein the data is to be programmed into a super block of the flash memory chips and the super block includes one multiple-level cell block of each flash memory chip among the flash memory chips; programming the data into the super block; writing and buffering the at least one set of parity check codes into a buffer memory; and, reading the at least one set of parity check codes from the buffer memory, then encoding the at least one set of parity check codes to generate at least one set of final parity check codes, and then programming the at least one set of final parity check codes into a plurality of data pages of one flash memory chip of the super block.

According to one embodiment of the present invention, a flash memory controller for accessing a flash memory module is provided. The flash memory module is a 3D flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines. Floating transistors on each bit line form at least one page among the plurality of data pages. The flash memory controller comprises a memory, a microprocessor, and a codec. The memory is configured for storing a program code. The microprocessor is configured for performing the program code to control access of the flash memory module. The codec is configured for performing encoding upon data to generate at least one set of parity check codes, wherein the data is to be programmed into a super block of the flash memory chips and the super block includes one multiple-level cell block of each flash memory chip among the flash memory chips. The microprocessor is arranged for programming the data into the super block, writing and buffering the at least one set of parity check codes into a buffer memory, reading the at least one set of parity check codes from the buffer memory, encoding the at least one set of parity check codes to generate at least one set of final parity check codes, and then programming the at least one set of final parity check codes into a plurality of data pages of one flash memory chip of the super block.

According to one embodiment of the present invention, a memory device is disclosed. The memory device comprises a flash memory module and a flash memory controller. The flash memory module is a 3D flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines. Floating transistors on each bit line form at least one page among the plurality of data pages. The flash memory controller is configured for accessing the flash memory module. When receiving a programming/writing instruction from a host device to program data into the flash memory module, the flash memory controller is arranged for: performing encoding upon data to generate at least one set of parity check codes wherein the data is to be programmed into a super block of the flash memory chips and the super block includes one multiple-level cell block of each flash memory chip among the flash memory chips, for programming the data into the super block, for writing and buffering the at least one set of parity check codes into a buffer memory, for reading the at least one set of parity check codes from the buffer memory, encoding the at least one set of parity check codes to generate at least one set of final parity check codes, and then for programming the at least one set of final parity check codes into a plurality of data pages of one flash memory chip of the super block.

According to one embodiment of the present invention, a method for accessing a flash memory module is further disclosed. The flash memory module is a 3D flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines. Floating transistors on each bit line form at least one page among the plurality of data pages. The method comprises: configuring and planning the flash memory chips so that the flash memory chips include at least one super block; and allocating a buffer memory space for storing multiple sets of temporary parity check codes generated by an encoding procedure during programming data into the at least one super block.

According to one embodiment of the present invention, a flash memory controller for accessing a flash memory module is further disclosed. The flash memory module is a 3D flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines. Floating transistors on each bit line format least one page among the plurality of data pages. The flash memory controller comprises a memory, a microprocessor, and a codec. The memory is configured for storing a program code. The microprocessor is configured for executing the program code to control access of the flash memory module. The microprocessor configures and plans the flash memory chips so that the flash memory chips include at least one super block, and allocates a buffer memory space for storing multiple sets of temporary parity check codes generated by an encoding procedure during programming data into the at least one super block.

According to one embodiment of the present invention, a memory device is further disclosed. The memory device comprises a flash memory module and a flash memory controller. The flash memory module is a 3D flash memory module including a plurality of flash memory chips, and each flash memory chip includes a plurality of blocks which include a plurality of multiple-level cell blocks. Each block includes a plurality of data pages and includes a plurality of word lines respectively disposed on a plurality of different planes and a plurality of floating transistors controlled by a plurality of bit lines. Floating transistors on each bit line form at least one page among the plurality of data pages. The flash memory controller is configured for accessing the flash memory module. The flash memory controller is further arranged for configuring and planning the flash memory chips so that the flash memory chips include at least one super block, and for assigning a buffer memory space for storing multiple sets of temporary parity check codes generated by an encoding procedure during programming data into the at least one super block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating multiple word line sets in one block.

FIG. 6 is a diagram illustrating an example of flash memory controller programming data into the super block according to a first embodiment of the present invention.

FIG. 8 is a diagram showing an example of adopting XOR calculation as the RAID encoding operation to generate eight sets of final parity check codes SF0-SF7 according to the parity check codes S0-S191 shown in FIG. 6.

FIG. 9 is a diagram illustrating an example of flash memory controller programming data into the super block according to a second embodiment of the present invention.

FIG. 11 is a diagram showing an example of adopting XOR calculation as the RAID encoding operation to generate eight sets of final parity check codes SF0-SF7 according to the parity check codes S0-S191 shown in FIG. 9.

DETAILED DESCRIPTION

Figure 1:
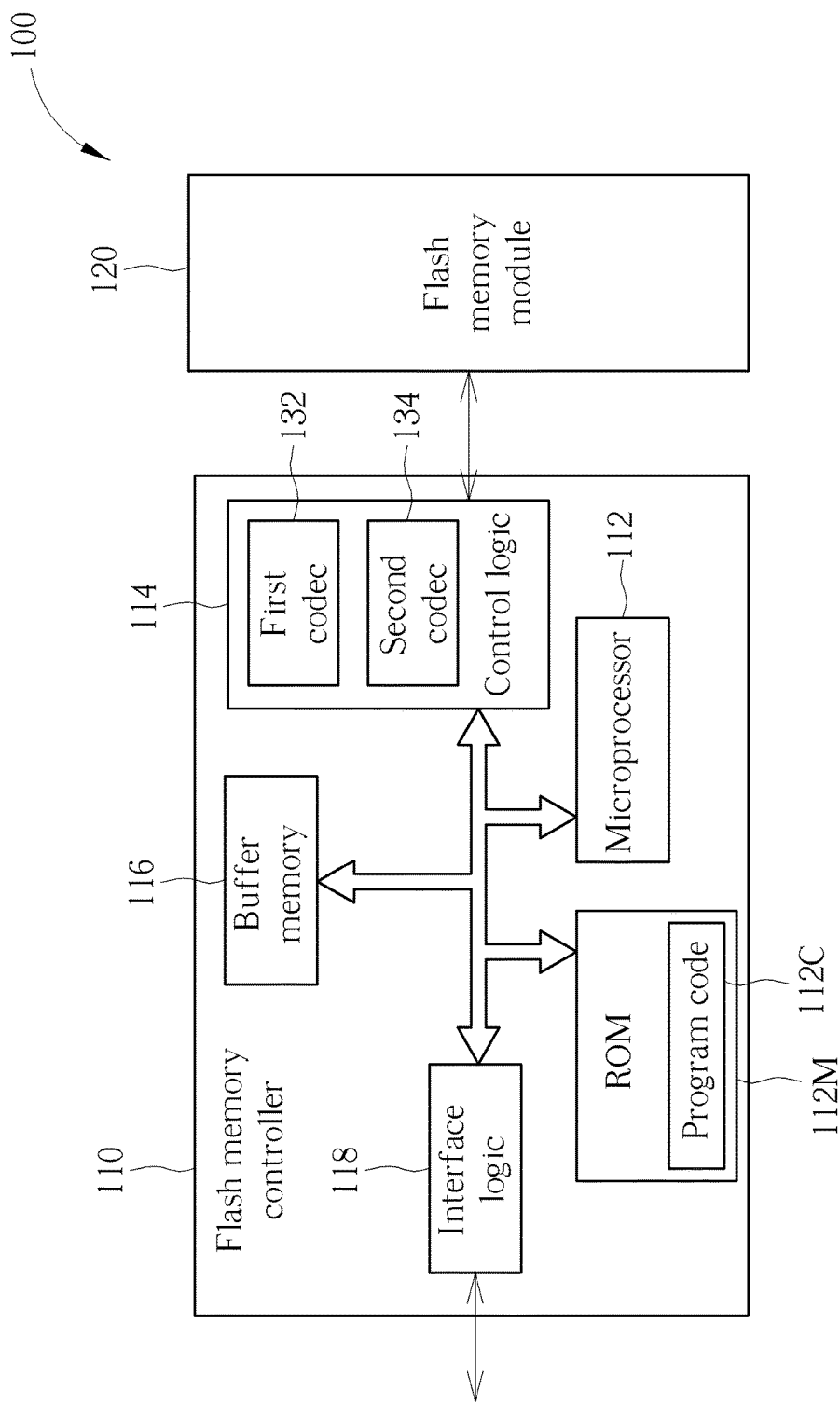
FIG. 1 is a diagram of a memory device according to an embodiment of the present invention.

Please refer to FIG. 1, which is a diagram of a memory device 100 according to an embodiment of the present invention. In the embodiment, the memory device 100 can be a portable memory device such as a memory card conforming to the standards of SD/NMC, CF, MS, and XD. The memory device 100 comprises a flash memory module 120 and a flash memory controller 110. The flash memory controller 110 is used for accessing the flash memory module 120. In the embodiment, the flash memory controller 110 comprises a microprocessor 112, read-only memory (ROM) 112M, control logic 114, buffer memory 116, and an interface logic 118. The read-only memory is used for storing program codes 112C. The microprocessor 112 is used for executing the program codes 112C to control the access of flash memory module 120. In other embodiments, the buffer memory 116 can be configured outside of the controller 110, and is implemented with a storage space allocated by a dynamic random access memory.

Typically, the flash memory module 120 may include multiple flash memory chips each including a plurality of blocks. For example, the controller, e.g. flash memory controller 110 executing the program codes 112C by using microprocessor 112, is arranged to perform copy, erase, and merge operations upon the flash memory module 120 wherein the copy, erase, and merge operations are performed block by block. Additionally, a block can record a particular number of data pages wherein the controller, e.g. flash memory controller 110 executing the program codes 112C by using microprocessor 112, is arranged to perform data programming upon the flash memory module 120 page by page.

In practice, the flash memory controller 110 executing the program codes 112C by using the microprocessor 112 can perform a variety of control operations by using its internal circuit elements. For instance, the controller 110 can use the control logic 114 to control the access of flash memory module 120 (more particularly to control the access of at least one block or at least one data page), use the buffer memory 116 to buffer data, and use the interface logic 118 to communicate with a host device (not shown in FIG. 1).

Additionally, in the embodiment, the control logic 114 comprises a first codec 132 and a second codec 134. The first codec 132 is used for encoding data which is to be programmed/written into a block of flash memory module 120 to generate a corresponding error correction code wherein the first codec 132 can generate the corresponding error correction code by referring to content of a sector of a data page. The generated error correction code with the content of the sector of the data page is written/programmed into the data page. Additionally, the second codec 134 is a RAID (Redundant Array of Independent Disks) compressor/decompressor used for encoding data to be programmed into multiple flash memory chips to generate corresponding parity check codes; the description is detailed later.

Figure 2:
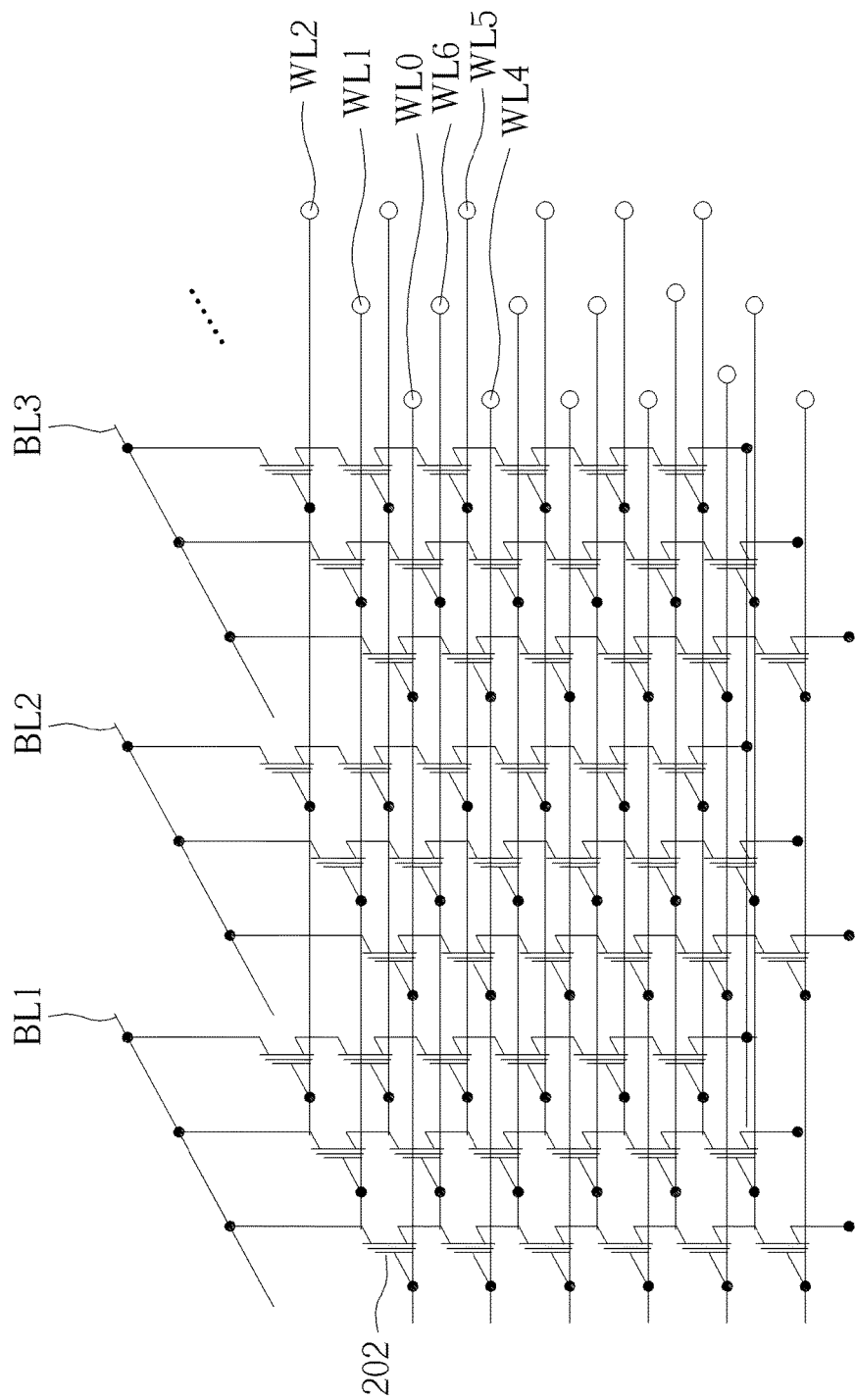
FIG. 2 is a diagram of a 3D NAND-type flash memory.

In the embodiment, the flash memory module 120 is a 3D NAND-type flash memory module. Please refer to FIG. 2, which is a diagram of a 3D NAND-type flash memory. As shown in FIG. 2, the 3D NAND-type flash memory comprises multiple floating gate transistors 202, and the structure of 3D NAND-type flash memory is made up of multiple bit lines (e.g. BL1-BL3) and multiple word lines (e.g. WL0-WL2 and WL4-WL6). One bit line can be also called one string. In FIG. 2, taking an example of a top plane, at least one data page constitutes all floating gate transistors on the word line WL0, and another at least one data page constitutes all floating gate transistors on the word line WL1; another at least one data page constitutes all floating transistors on the word line WL2, and other so on. Further, for example, the definition of one data page (logic data page) and the relation between such data page and word line WL0 may be different, and which may depend on different data programming types adopted by the flash memory. Specifically, all floating gate transistors on the word line WL0 correspond to one single logic data page when the flash memory adopts single-level cell (SLC) data programming. All floating gate transistors on the word line WL0 may correspond to two, three, or four logic data pages when the flash memory adopts multi-level cell (MLC) data programming. For example, a triple-level cell (TLC) memory structure means that all floating gate transistors on the word line WL0 correspond to three logical data pages. Instead, a quad-level cell (QLC) memory structure means that all floating gate transistors on the word line WL0 correspond to four logical data pages. The description for the TLC memory structure or QLC memory structure is not detailed here for brevity. Additionally, for the program/erase operation of flash memory controller 110, one data page is a minimum data unit which is programmed by the controller 110 into the module 120, and one block is a minimum data unit which is erased by the controller 110; that is, the controller 110 programs at least one data page for one data programming operation, and erases at least one block for one erase operation.

Figure 3:
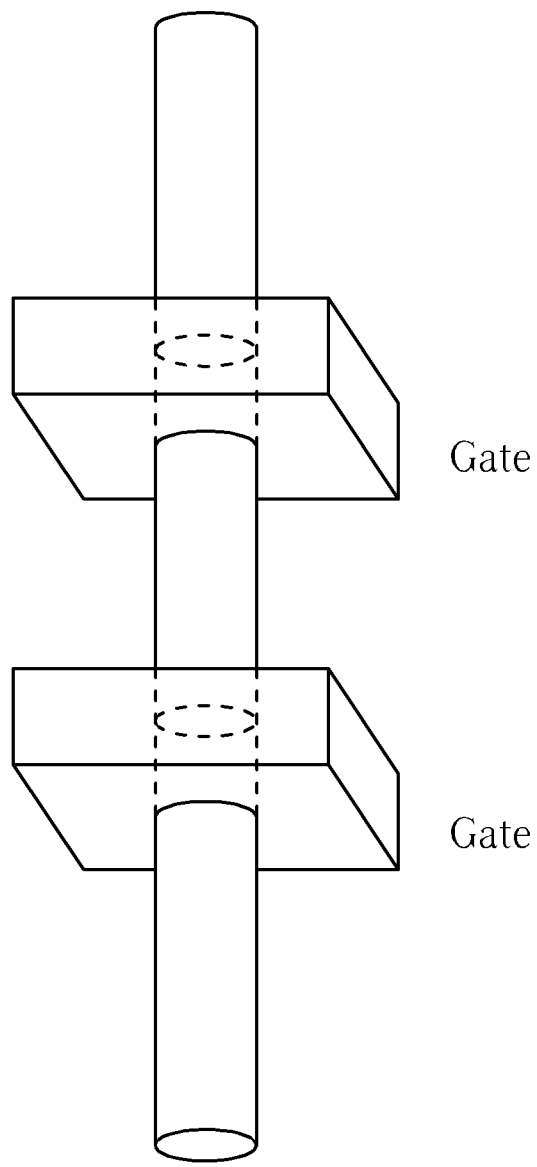
FIG. 3 is a schematic diagram illustrating floating gate transistors.

Please refer to FIG. 3, which is a schematic diagram illustrating floating gate transistors 202. As shown in FIG. 3, the gate and floating gate of each floating gate transistor are disposed all around its source and drain, to improve the capability of channel sensing.

It should be noted that the examples of 3D NAND-type flash memory and floating gate transistors 202 shown in FIG. 2 and FIG. 3 are not meant to be limitations of the present invention. In other embodiments, 3D NAND-type flash memory may be designed or configured as different structures; for example, a portion of word lines may be mutually connected. Also, the design or configuration of floating gate transistor 202 may be modified as different structures.

As mentioned above, in some conventional 3D NAND-type flash memory structure, multiple word lines are defined as or classified into a word line set, i.e. a set of word lines, and such word line set correspond to or include a common control circuit. This inevitably causes that data errors occur at other floating gate transistors on the other word lines of such word line set when programming data to the floating gate transistors on a word line of such word line set fails. In the embodiment, the word lines disposed/positioned on the same plane is configured as or classified into a word line set. Refer back to FIG. 2. Word lines WL0-WL3 are classified into a first word line set, and word lines WL4-WL7 are classified into a second word line set; and other so on. Refer to FIG. 4, which is a diagram illustrating multiple word line sets in one block. As shown in FIG. 4, it is assumed that the block has forty-eight 3D stacked planes, i.e. 48 word line sets. Each word line set has four word lines and thus has all transistors on total one hundred and ninety-two word lines. As shown in FIG. 4, the block has forty-eight word line sets which are represented by WL_G0-WL_G47. Additionally, in this figure, the block is a TLC block. That is, floating gate transistors on each word line can be used for storing data content of three data pages. As shown by FIG. 4, for example, floating gate transistors on word line WL0 included by the word line set WL_G0 can be used for storing lower data page P0L, middle data page P0M, and upper data page P0U. The floating gate transistors on word line WL1 included by the word line set WL_G0 can be used for storing lower data page P1L, middle data page P1M, and upper data page P1U. The floating gate transistors on word line WL2 included by the word line set WL_G0 can be used for storing lower data page P2L, middle data page P2M, and upper data page P2U. The floating gate transistors on word line WL3 included by the word line set WL_G0 can be used for storing lower data page P3L, middle data page P3M, and upper data page P3U. When the controller 110 programs or writes data into the data pages of word line set WL_G0, the controller 110 is arranged for sequentially programs data into the floating gate transistors on word lines WL0, WL1, WL2, and WL3. Even if data is successfully programmed into word lines WL0 and WL1 but programming other data into word line WL2 fails (i.e. program fail), programming fail will occur at the word line set WL_G0 since the program fail of word line WL2 causes errors at the word lines WL0 and WL1.

Further, in some situations, even data has been successfully programmed into the word line set WL_G0, there is a possibility that the data cannot be readout from word line set WL_G0 or reading errors occur. For instance, the data cannot be read if one word line open occurs; all the data of one word line set will become erroneous if one word line in such word line set is open. Further, if two word lines in different word line sets are shorted (e.g. word lines WL3 and WL4 are shorted), then all the data of two word line sets WL_G0 and WL_G1 cannot be read successfully. That is, the two word line sets WL_G0 and WL_G1 are equivalently shorted.

As mentioned above, since data errors may occur at one or two adjacent word line set(s) due to the program fail, word line open, and word line short when programming data into or reading data from a flash memory, to solve the problems, in the embodiment a method/mechanism for accessing flash memory module 120 is provided. One of the advantages is that the method/mechanism merely consumes less resource (i.e. occupies less memory space). The description of the method/mechanism is detailed in the following.

Figure 5:
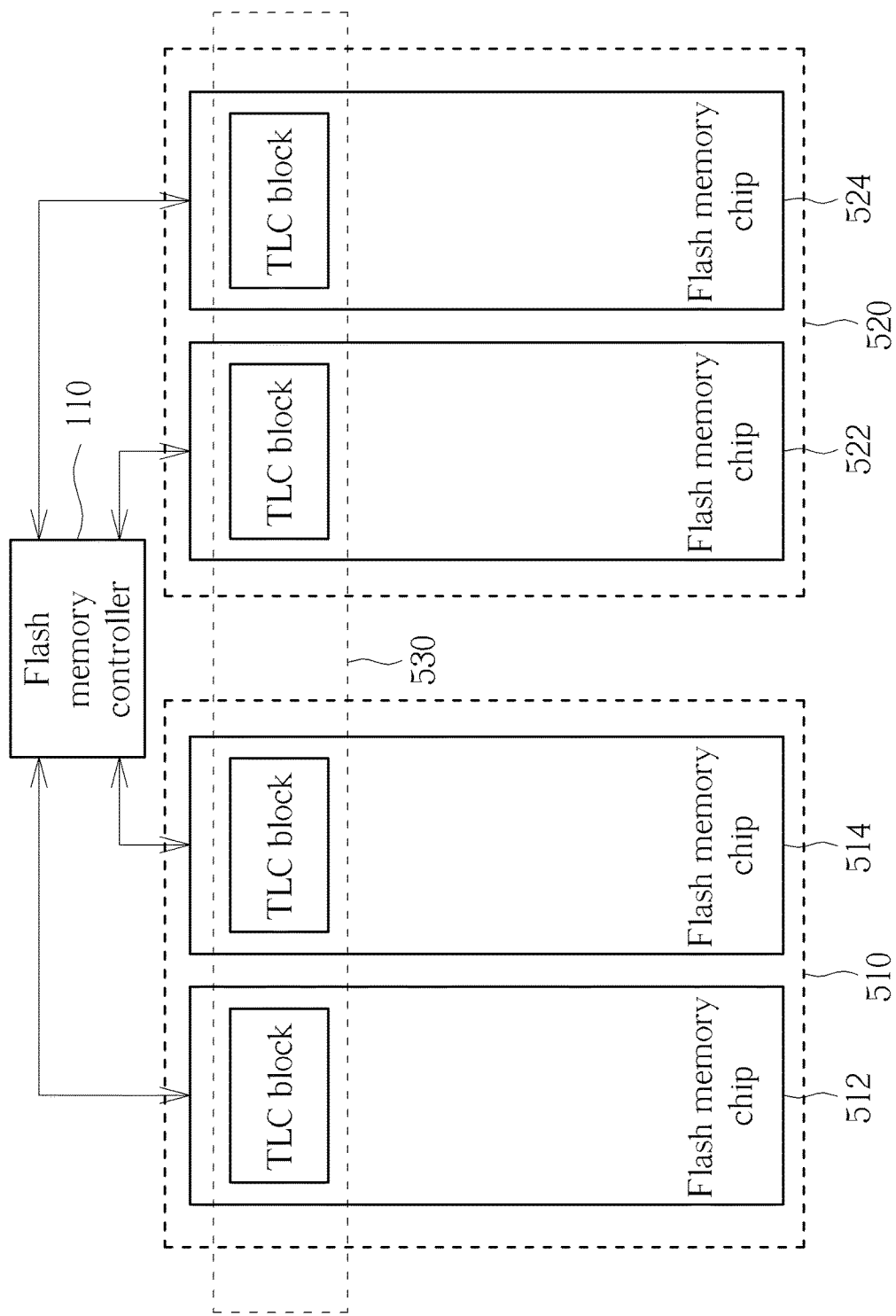
FIG. 5 is a diagram illustrating an example of the flash memory controller programming data into the flash memory module.

Please refer to FIG. 1 in conjunction with FIG. 5. FIG. 5 is a diagram illustrating an example of the flash memory controller 110 programming data into the flash memory module 120. As shown in FIG. 5, the flash memory module 120 comprises multiple channels (in the embodiment, two channels 510 and 520), and each channel corresponds to a sequencer of flash memory controller 110 and comprises multiple flash memory chips. In the embodiment, the channel 510 comprises flash memory chips 512 and 514, and the channel 520 comprises flash memory chips 522 and 524. Additionally, a super block consists of one block of each flash memory chip 512, 514, 522, and 524. The flash memory controller 110 is arranged for programming data by super blocks. During data programming, the control logic 114 of flash memory controller 110 is arranged for temporarily storing temporary and partial parity check codes generated by the second codec 134 in the buffer memory 116 and reading the temporary and partial parity check codes from the buffer memory 116 by accessing the buffer memory 116. In practice, the buffer memory 116 can be implemented with a dynamic random access memory (DRAM), and the circuit cost can be reduced correspondingly. For example, a DRAM can be adopted to store data by a general data area, a lookup table data area, and to temporarily store parity check codes or partial parity check codes by further allocating a memory storage space of the DRAM; the allocated memory storage space can be a space with a fixed physical address or a logic address. In the embodiment, the super block 530 comprises one TLC block of each flash memory chip 512, 514, 522, and 524. In other embodiments, the super block 530 may comprise one QLC block of each flash memory chip 512, 514, 522, and 524. This is not meant to be a limitation.

Refer to FIG. 6, which is a diagram illustrating an example of flash memory controller 110 programming data into the super block 530 according to a first embodiment of the present invention. Each data unit is programmed into respective one page of flash memory chips 512, 514, 522, and 524. For instance, the first data unit is programmed into the lower data page P0L, middle data page P0M, and upper data page P0U of respective first data page P0 of flash memory chips 512, 514, 522, and 524. The second data unit is programmed into the lower data page P1L, middle data page P1M, and upper data page P1U of respective second data page P1 of flash memory chips 512, 514, 522, and 524; and others so on. The (N)-th data unit is programmed into the lower data page P(N−1)L, middle data page P(N−1)M, and upper data page P(N−1)U of respective (N)-th data page P(N−1) of flash memory chips 512, 514, 522, and 524; for example, N is equal to 192.

When the flash memory controller 110 is arranged to program the first data unit into the super block 530, the first codec 132 encodes different portions of the first data unit to generate corresponding error correction codes, and then the first data unit with the corresponding error correction codes generated by the first codec 132 are to be programmed into a first data page P0 of each of flash memory chips 512, 514, 522, and 524. Specifically, the first codec 132 encodes a first data portion of the first data unit to generate an error correction code, and the first data portion with the generated error correction code are to be programmed into lower data page P0L, middle data page P0M, and upper data page P0U of the first data page P0 of flash memory chip 512. The first codec 132 then encodes a second data portion of the first data unit to generate an error correction code, and the second data portion with the generated error correction code are to be programmed into lower data page P0L, middle data page P0M, and upper data page P0U of the first data page P0 of flash memory chip 514. The first codec 132 then encodes a third data portion of the first data unit to generate an error correction code, and the third data portion with the generated error correction code are to be programmed into lower data page P0L, middle data page P0M, and upper data page P0U of the first data page P0 of flash memory chip 522. The first codec 132 then encodes a fourth data portion (a last data portion) of the first data unit to generate an error correction code, and the fourth data portion with the generated error correction code are to be programmed into lower data page P0L, middle data page P0M, and upper data page P0U of the first data page P0 of flash memory chip 524. It should be noted that the operation of first codec 132 can be performed upon one sector data each time, and each data page consists of multiple sectors.

Before programming/writing the first data unit with the error correction codes generated by the first codec 132 into the super block 530, the second codec 134 of flash memory controller 110 is arranged for performing RAID encoding upon the first data unit with the error correction codes to generate a first set of parity check codes S0. In one embodiment, the second codec 134 can employ RS (Reed-Solomon) encoding operation or XOR (exclusive-OR) encoding operation upon the data content to be programmed into the first data page P0 of each of flash memory chips 512, 514, 522, and 524, to generate the first set of parity check codes S0. For example, the second codec 134 can be arranged to perform an XOR encoding operation upon data content of lower data pages P0L of first data pages P0 of flash memory chips 512, 514, 522, and 524 to generate a first partial parity check code S0L in the first set of parity check codes S0, to perform an XOR encoding operation upon data content of middle data pages P0M of first data pages P0 of flash memory chips 512, 514, 522, and 524 to generate a second partial parity check code S0M in the first set of parity check codes S0, and to perform an XOR encoding operation upon data content of upper data pages P0U of first data pages P0 of flash memory chips 512, 514, 522, and 524 to generate a third partial parity check code S0U in the first set of parity check codes S0. That is, the first set of parity check codes S0 comprises first partial parity check code S0L, second partial parity check code S0M, and third partial parity check code S0U, and these three partial parity check codes are generated by distinct XOR encoding operations. In practice, the second codec 134 may comprise three codec engines used for generating the three partial parity check codes. Similarly, for each of other sets of parity check codes, the three codec engines of second codec 134 can be employed for respectively generating corresponding three different partial parity check codes. Further, if an RS encoding operation is adopted in another embodiment, the second codec 134 can directly perform the RS encoding operation upon the data content of first data pages P0 of flash memory chips 512, 514, 522, and 524 to generate the first set of parity check codes S0 without using the three codec engines.

The first set of parity check codes S0 generated by second codec 134 is used for correcting error(s) occurring at first data page P0 of anyone flash memory chip among the flash memory chips 512, 514, 522, and 524. Taking the example of XOR encoding operation, if errors occur at the lower data page P0L of first data page P0 of flash memory chip 512 and cannot be corrected by the error correction codes generated by first codec 132, the second codec 134 can be arranged to read data content of lower data pages P0L of all first data pages P0 of other flash memory chips 514, 522, 524 and the first partial parity check code S0L of first set of parity check codes S0 from the module 120 to perform error correction so as to determine correct data content of lower data page P0L of first data page P0 of flash memory chip 512. Similarly, if errors occur at the middle data page P0M of first data page P0 of flash memory chip 512 and cannot be corrected by the error correction codes generated by first codec 132, the second codec 134 can be arranged to read data content of middle data pages P0M of all first data pages P0 of other flash memory chips 514, 522, 524 and the second partial parity check code S0M of first set of parity check codes S0 from the module 120 to perform error correction so as to determine correct data content of middle data page P0M of first data page P0 of flash memory chip 512. Similarly, if errors occur at the upper data page P0U of first data page P0 of flash memory chip 512 and cannot be corrected by the error correction codes generated by first codec 132, the second codec 134 can be arranged to read data content of upper data pages P0U of all first data pages P0 of other flash memory chips 514, 522, 524 and the third partial parity check code S0U of first set of parity check codes S0 from the module 120 to perform error correction so as to determine correct data content of upper data page P0U of first data page P0 of flash memory chip 512.

Further, taking the example of RS encoding operation, if errors occur at the first data page P0 of flash memory chip 512 and cannot be corrected by the error correction codes generated by first codec 132, the second codec 134 can be arranged to read data content of all first data pages P0 of other flash memory chips 514, 522, 524 and the first set of parity check codes S0 from the module 120 to perform error correction so as to determine correct data content of first data page P0 of flash memory chip 512.

Further, the first set of parity check codes S0 generated by second codec 134 can be temporarily stored in the buffer memory 116 of flash memory controller 110.

Further, during data programming of the first data unit, the flash memory controller 110 can be arranged to read and then check the data to determine whether the data has been programmed successfully. When the data is erroneously programmed or program fails, the second codec 134 can directly use the first set of parity check codes S0 stored in the buffer memory 116 to correct the data which has been read for checking. Since the flash memory module 120 does not directly correct/modify data which has been programmed, the corrected data (i.e. the first data unit has been corrected) with other data of super block 530 can be programmed into another super block after a waiting time period.

When the flash memory controller 110 is arranged to program a second data unit into the super block 530, the first codec 132 encodes different portions of the first data unit to generate corresponding error correction codes, and then the second data unit with the corresponding error correction codes generated by the first codec 132 are to be programmed into a second data page P1 of each of flash memory chips 512, 514, 522, and 524. Before programming/writing the second data unit with the error correction codes generated by the first codec 132 into the super block 530, the second codec 134 of flash memory controller 110 is arranged for performing RAID encoding upon the second data unit with the error correction codes to generate a second set of parity check codes S1. In one embodiment, the second codec 134 can employ RS (Reed-Solomon) encoding operation or XOR (exclusive-OR) encoding operation upon the data content to be programmed into the second data page P1 of each of flash memory chips 512, 514, 522, and 524, to generate the second set of parity check codes S1. For example, the second codec 134 can be arranged to perform an XOR encoding operation upon data content of lower data pages P1L of second data pages P1 of flash memory chips 512, 514, 522, and 524 to generate a first partial parity check code S1L in the second set of parity check codes S1, to perform an XOR encoding operation upon data content of middle data pages P1M of second data pages P1 of flash memory chips 512, 514, 522, and 524 to generate a second partial parity check code S1M in the second set of parity check codes S1, and to perform an XOR encoding operation upon data content of upper data pages P1U of second data pages P1 of flash memory chips 512, 514, 522, and 524 to generate a third partial parity check code S1U in the second set of parity check codes S1. That is, the second set of parity check codes S1 comprises first partial parity check code S1L, second partial parity check code S1M, and third partial parity check code S1U, and these three partial parity check codes are generated by distinct XOR encoding operations. In practice, the second codec 134 may comprise three codec engines used for generating the three partial parity check codes. Similarly, for each of other sets of parity check codes, the three codec engines of second codec 134 can be employed for respectively generating corresponding three different partial parity check codes. Further, if an RS encoding operation is adopted in another embodiment, the second codec 134 can directly perform the RS encoding operation upon the data content of second data pages P1 of flash memory chips 512, 514, 522, and 524 to generate the second set of parity check codes S1 without using the three codec engines.

Further, the second set of parity check codes S1 generated by second codec 134 can be temporarily stored in the buffer memory 116 of flash memory controller 110. Similarly, during data programming of the second data unit, the flash memory controller 110 can be arranged to read and then check the data to determine whether the data has been programmed successfully. When the data is erroneously programmed or program fails, the second codec 134 can directly use the second set of parity check codes S1 stored in the buffer memory 116 to correct the data which has been read for checking. Since the flash memory module 120 does not directly correct/modify data which has been programmed, the corrected data (i.e. the second data unit has been corrected) with other data of super block 530 can be programmed into another super block after a waiting time period.

It should be noted that the data pages P0 of flash memory chips 512, 514, 522, and 524 may be damaged when data is erroneously programmed during data programming of the second data unit since the data pages P0 and P1 belong into the same word line set WL_G0. For instance, if data is erroneously programmed into the data page P1 of flash memory chip 514 during data programming of the second data unit, then errors will occur at the data page P0 in flash memory chip 514, which has been successfully programmed. In this situation, the first set of parity check codes S0 may be not stored in the buffer memory 116, and thus the flash memory controller 110 can read the first set of parity check codes S0 from the super block 530 to correct the first data unit which is read out from the super block 530.

Based on the same operation, the flash memory controller 110 programs/writes a third data unit into the third data pages P2 of flash memory chips 512, 514, 522, and 524 and generates a corresponding third set of parity check codes S2, and then programs/writes a fourth data unit into the fourth data pages P3 of flash memory chips 512, 514, 522, and 524 and generates a corresponding fourth set of parity check codes S3. After that, data programming for the word line set WL_G0 is completed. Similarly, the flash memory controller 110 is arranged to respectively program/write the fifth, sixth, seventh, and eighth data units into the respective data pages P4, P5, P6, and P7 of flash memory chips 512, 514, 522, and 524, and to generate the first, second, third, and fourth sets of parity check codes S4, S5, S6, and S7 of the corresponding word line set WL_G1, so as to complete the data programming of word line set WL_G1. In addition, to reduce the circuit costs, the buffer memory 116 can be implemented by using a DRAM which can allocate a storage space for temporarily storing parity check codes of RAID encoding operations of the flash memory controller 110. The controller 110 can be arranged to immediately store a set of parity check codes in the buffer memory 116 after generating such set of parity check codes, or to not temporarily store eight sets of parity check codes in the buffer memory 116 until generating the eight sets of parity check codes.

Similarly, the flash memory controller 110 then is arranged for respectively programming/writing the fifth, sixth, seventh, ..., and (184)-th data units into flash memory chips 512, 514, 522, and 524 wherein the second codec 134 is arranged for performing RAID encoding operation upon the fifth, sixth, seventh, ..., and (184)-th data units to respectively generate different sets of parity check codes S8, S9, S10, ..., and S183 corresponding to word line sets WL_G2, ..., WL_G45 and is storing the different sets of parity check codes S8, S9, S10, ..., and S183 in the buffer memory 116.

For the last two word line sets WL_G46 and WL_G47 of super block 530, the controller 110 is arranged for processing corresponding parity check codes and programming the processed parity check codes into data pages P184-P191 of the last chip (i.e. chip 524). In order to solve the problems generated due to program fail, word line open, and word line short of word line set (s), the controller 110 is arranged to classify all word line sets into a group of multiple odd word line sets (i.e. WL_G0, WL_G2, WL_G4, WL_G6, ..., WL_G44, and WL_G46) and a group of multiple even multiple word line sets (i.e. WL_G1, WL_G3, WL_G5, WL_G7, ..., WL_G45, and WL_G47) according to the order of data programming when processing corresponding parity check codes. For the (185)-th data unit, the flash memory controller 110 is arranged for programming/writing the (185)-th data unit with the error correction code generated by first codec 132 into the data pages P184 of flash memory chips 512, 514, and 522 (i.e. the last word line set WL_G46 among the group of odd word line sets), and does not program the data into the data page P184 of flash memory chip 524. Before programming/writing the (185)-th data unit into super block 530, the second codec 134 is arranged for encoding the (185)-th data unit and the corresponding error correction code to generate the (185)-th set of parity check codes S184. Taking an example of RS encoding, the flash memory controller 110 is arranged for reading the first sets of parity check codes (S0, S8, S16, ..., S176) of each word line set among the group of odd word line sets (i.e. WL_G0, WL_G2, WL_G4, WL_G6, ..., WL_G44) from the buffer memory 116, and the second codec 134 is arranged for performing RS encoding operation upon the parity check codes (S0, S8, S16, ..., S176) with parity check codes S184 to generate/obtain a final/resultant parity check code SF0. The flash memory controller 110 then programs the final/resultant parity check code SF0 into the data page P184 of flash memory chip 524. Additionally, taking an example of XOR operation as the RAID encoding scheme, in one embodiment, the second codec 134 is arranged for using the first encoding engine to perform one XOR operation upon all the first partial parity check codes (S0L, S8L, S16L, ..., S176L, S184L) of parity checks (S0, S8, S16, ..., S176, S184) to generate a first partial parity check code of the final parity check code SF0. The second codec 134 is arranged for using the second encoding engine to perform one XOR operation upon all the second partial parity check codes (S0M, S8M, S16M, ..., S176M, S184M) of parity checks (S0, S8, S16, ..., S176, S184) to generate a second partial parity check code of the final parity check code SF0. The second codec 134 is arranged for using the third encoding engine to perform one XOR operation upon all the third partial parity check codes (S0U, S8U, S16U, ..., S176U, S184U) of parity checks (S0, S8, S16, ..., S176, S184) to generate a third partial parity check code of the final parity check code SF0. The first, second, and third partial parity check codes of final parity check code SF0 are respectively programmed by the controller 110 into the lower data page, middle data page, and upper data page of the data page P184 of flash chip 524.

Similarly, For the (186)-th, (187)-th, (188)-th data units, the flash memory controller 110 is arranged for respectively programming/writing the (186)-th, (187)-th, (188)-th data units with the corresponding error correction codes generated by first codec 132 into the data pages P185, P186, P187 of flash memory chips 512, 514, and 522 (i.e. the last word line set WL_G46 among the group of odd word line sets), and does not program the data into the data pages P185, P186, P187 of flash memory chip 524. For the (186)-th data unit, before programming/writing the (186)-th data unit into super block 530, the second codec 134 is arranged for encoding the (186)-th data unit and the corresponding error correction code to generate the (186)-th set of parity check codes S185. Taking an example of RS encoding, the flash memory controller 110 is arranged for reading the second sets of parity check codes (S1, S9, S17, ..., S177) of each word line set among the group of odd word line sets (i.e. WL_G0, WL_G2, WL_G4, WL_G6, ..., WL_G44) from the buffer memory 116, and the second codec 134 is arranged for performing RS encoding operation upon the parity check codes (S1, S9, S17, ..., S177) with parity check codes S185 to generate/obtain a final/resultant parity check code SF1. The flash memory controller 110 then programs the final/resultant parity check code SF1 into the data page P185 of flash memory chip 524. Additionally, taking an example of XOR operation as the RAID encoding scheme, in one embodiment, the second codec 134 is arranged for using the first encoding engine to perform one XOR operation upon all the first partial parity check codes (S1L, S9L, S17L, ..., S177L, S185L) of parity checks (S1, S9, S17, ..., S177, S185) to generate a first partial parity check code of the final parity check code SF1. The second codec 134 is arranged for using the second encoding engine to perform one XOR operation upon all the second partial parity check codes (S1M, S9M, S17M, . . . , S177M, S185M) of parity checks (S1, S9, S17, . . . , S177, S185) to generate a second partial parity check code of the final parity check code SF1. The second codec 134 is arranged for using the third encoding engine to perform one XOR operation upon all the third partial parity check codes (S1U, S9U, S17U, . . . , S177U, S185U) of parity checks (S1, S9, S17, . . . , S177, S185) to generate a third partial parity check code of the final parity check code SF1. The first, second, and third partial parity check codes of final parity check code SF1 are respectively programmed by the controller 110 into the lower data page, middle data page, and upper data page of the data page P185 of flash chip 524.

Based on the similar operation, for the (189)-th, (190)-th, (191)-th, and (192)-th data units, the flash memory controller 110 is arranged for programming/writing the (189)-th, (190)-th, (191)-th, and (192)-th data units with corresponding error correction codes generated by first codec 132 into data pages P188, P189, P190, and P191 of flash memory chips 512, 514, and 522. The second codec 134 also generates first, second, third, and fourth final parity check codes (SF4, SF5, SF6, and SF7) of each of the group of even word line sets based on similar operations, and respectively programs/writes the final parity check codes (SF4, SF5, SF6, and SF7) into data pages P188, P189, P190, and P191 of flash memory chip 524.

Figure 7:
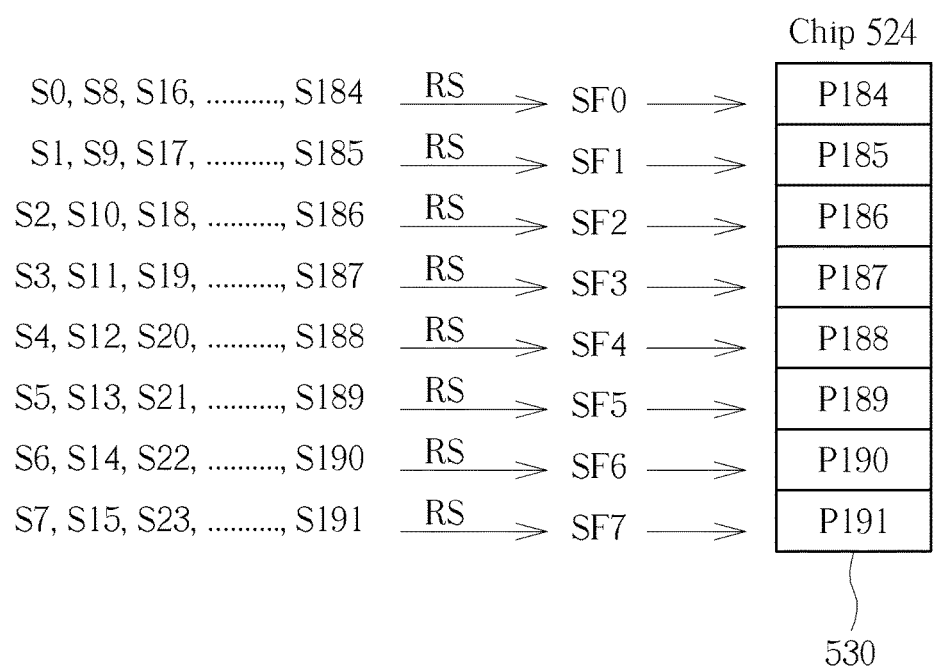
FIG. 7 is a diagram showing an example of adopting RS encoding operation as the RAID encoding operation to generate eight sets of final parity check codes SF0-SF7 according to the parity check codes S0-S191 shown in FIG. 6.

The operations for generating the final parity check codes SF0-SF7 of the group of odd word line sets and group of even word line sets according to the multiple sets of parity check codes S0-S191 are illustrated in FIG. 7 and FIG. 8. FIG. 7 is a diagram showing an example of adopting RS encoding operation as the RAID encoding operation. FIG. 8 is a diagram showing an example of adopting XOR calculation as the RAID encoding operation.

It should be noted that the above-mentioned final parity check codes SF0-SF7 are correspondingly generated based on the parity check codes S0-S191. The final parity check codes SF0-SF7 substantially carry information of each of the parity check codes S0-S191. That is, each of multiple sets of parity check codes S0-S191 can be obtained according to corresponding data pages of flash memory chips. For example, the set of parity check codes S1 can be obtained by reading data from the data pages P1 of flash memory chips 512, 514, 522, and 524. Thus, the final parity check codes SF0-SF7 can be used to correct errors if data errors occur. For instance, if one word line in the word line set WL_G0 is open (e.g. a word line corresponding to data pages P0 of flash memory chip 514 is open), the flash memory controller 110 can re-generate parity check codes S8, S16, . . . , S184 and final parity check code SF0 by reading data from other word line sets so as to re-generate the set of parity check codes S0, and then can use the set of parity check codes S0 and data content read from the data pages P0 of flash memory chips 512, 522, and 524 to generate data of the data pages P0 of flash memory chip 514. The flash memory controller 110 can re-generate parity check codes S9, S17, . . . , S185 and final parity check codes SF1 by reading data from other word line sets so as to re-generate the set of parity check codes S1, and then can use the set of parity check codes S1 and data content read from the data pages P1 of flash memory chips 512, 522, and 524 to generate data of the data pages P1 of flash memory chip 514. Also, the flash memory controller 110 can re-generate data of data pages P2 and P3 of flash memory chip 514 similarly. As mentioned above, by the above operation, the data errors can be properly corrected to recover the data only if no multiple word lines in super block 530 are open simultaneously.

Additionally, if two word lines respectively positioned at word line sets WL_G0 and WL_G1 are short (e.g. two word lines correspondingly to the data pages P3 and P4 of flash memory chip 514 are short), the corresponding data can be also properly corrected to recover the data content of word line sets WL_G0 and WL_G1.

It should be noted that each of data pages P0-P191 as shown in FIG. 6 in other embodiments may indicate to comprise two or four data pages and is not limited to comprise only three data pages. For example, in the MLC flash memory structure, each of data pages P0-P191 has two data pages; in the QLC flash memory structure, each of data pages P0-P191 has four data pages.

Figure 10:
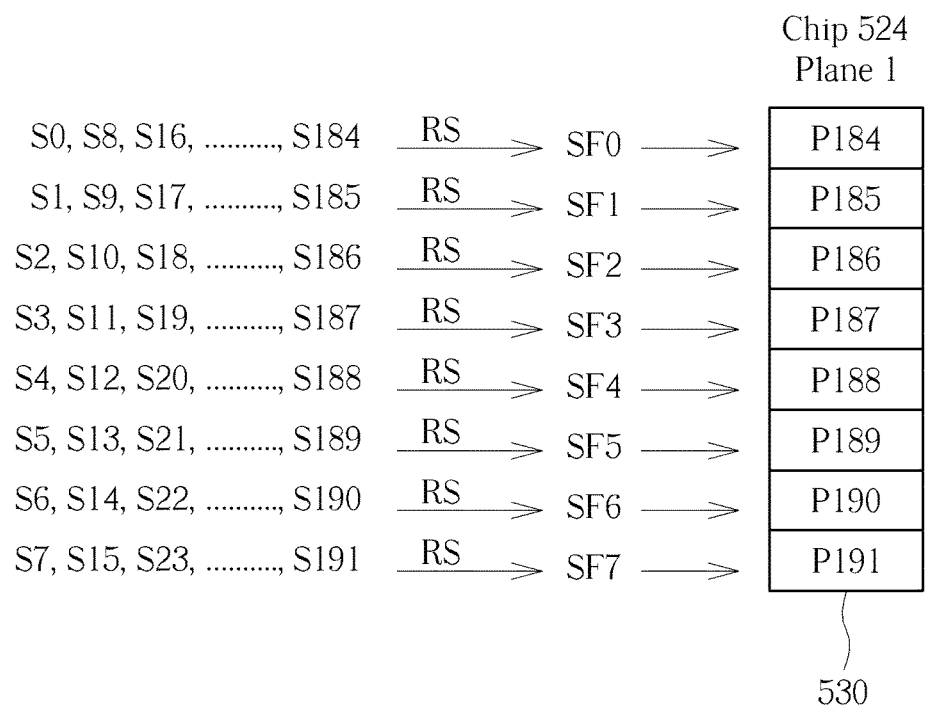
FIG. 10 is a diagram showing an example of adopting RS encoding operation as the RAID encoding operation to generate eight sets of final parity check codes SF0-SF7 according to the parity check codes S0-S191 shown in FIG. 9.

Additionally, in the embodiment of FIG. 5, the super block 530 consists of one TLC block of each of flash memory chips 512, 514, 522, and 524. However, in other embodiments, the flash memory module 120 may be configured as two block planes, and the super block 530 consists of two TLC blocks of each of flash memory chips 512, 514, 522, and 524. FIG. 9 is a diagram showing an example of flash memory controller 110 programming/writing data into the super block 530. FIG. 10 is a diagram showing an example of generating eight sets of final parity check codes SF0-SF7 by using RS encoding operation according to the multiple sets of parity check codes S0-S191 as shown in FIG. 9. FIG. 11 is a diagram showing an example of generating eight sets of final parity check codes SF0-SF7 by using XOR encoding operation according to the multiple sets of parity check codes S0-S191 as shown in FIG. 9. The operations of the embodiment in FIGS. 9, 10, and 11 are similar to those described in FIGS. 6, 7, and 8; the detailed description is not described for brevity.

To simply describe the spirits of the present invention, for the method for accessing the flash memory module, the second codec is arranged for sequentially performing encoding operations for multiple different data of multiple-layer blocks in one super block and storing temporary parity check codes, which are correspondingly generated, in a buffer memory. The buffer memory for example is a storage space allocated from a DRAM to avoid the usage of a static random access memory (SRAM) so as to reduce circuit costs as far as possible. The second codec then is arranged for reading the temporary parity check codes stored in the buffer memory to generate final parity check codes having less data amount, and for storing the final parity check codes in last data pages of the last set among the group of odd word line sets and in last data pages of the last set among the group of even word line sets. By doing so, in addition to being capable of properly correcting data errors generated due to program fail, word line open, and word line short, the needed storage space of buffer memory in the flash memory controller can be significantly decreased, and it is not required to employ too much storage space to store the parity check codes. That is, the circuit costs of flash memory controller can be reduced, and the efficiency for using the flash memory module is improved greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, the flash memory module being a 3D NAND-type flash memory module including a plurality of flash memory chips, each flash memory chip including a plurality of blocks which include a plurality of multiple-level cell blocks, each block including a plurality of data pages and including a plurality of word lines respectively disposed on a plurality of different planes and a plurality of floating transistors controlled by a plurality of bit lines, floating transistors on each bit line forming at least one page among the plurality of data pages, and the method comprises:
performing encoding upon data to generate at least one set of parity check codes, wherein the data is to be programmed into a super block of the flash memory chips and the super block includes one multiple-level cell block of each flash memory chip among the flash memory chips;
programming the data into the super block;
writing and buffering the at least one set of parity check codes into a buffer memory; and
reading the at least one set of parity check codes from the buffer memory, then encoding the at least one set of parity check codes to generate at least one set of final parity check codes, and then programming the at least one set of final parity check codes into a plurality of data pages of one flash memory chip of the super block;
wherein each flash memory chip of the 3D NAND-type flash memory module has a plurality of 3D stacked planes; all word lines disposed on a same 3D stacked plane are classified into a same word line set all word line sets are classified into a group of multiple odd word line sets and a group of multiple even word line sets; and, the at least one set of parity check codes is generated for data disposed on particular word lines associated with a same order respectively comprised within different non-adjacent word line sets, the different non-adjacent word line sets being the multiple odd word line sets or the multiple even word line sets.

2. The method of claim 1, further comprising:
when error(s) occurring due to programming for the data or program fail, directly using the at least one set of parity check codes temporarily stored in the buffer memory to correct the error(s) of the data.

3. The method of claim 1, further comprising:
during the data being programmed into the super block:
reading a portion of the data, which has been written into the super block, from the super block; and
reading at least one portion of parity check codes from the buffer memory and using the at least one portion of parity check codes to perform error correction upon the portion of the data when an error occurs and cannot corrected during reading the portion of the data.

4. The method of claim 1, wherein the step of performing encoding upon the data to generate the at least one set of parity check codes comprises:
sequentially performing encoding upon first to N-th data units to generate first to N-th sets of parity check codes; and
the step of programming the data into the super block comprises:
respectively programming the first to N-th data units into first data pages to N-th data pages corresponding to the flash memory chips of the super block; and
the step of programming the at least one set of parity check codes into the buffer memory comprises:
programming the first to N-th sets of parity check codes into the buffer memory.

5. The method of claim 4, wherein the at least one set of parity check codes is at least one set of temporary parity check codes, and the method further comprises:
reading the first to N-th sets of parity check codes from the buffer memory to generate multiple sets of final parity check codes according to the first to N-th sets of parity check codes; and
programming the multiple sets of final parity check codes into the super block.

6. The method of claim 5, wherein multiple word lines positioned on a same plane of each block forms a word line set, and the step of programming the multiple sets of final parity check codes into the super block comprises:
programming the multiple sets of final parity check codes into data pages of a flash memory chip corresponding to last two word line sets of the super block.

7. The method of claim 1, wherein the multiple-level cell blocks are triple-level cell (TLC) blocks or quad-level cell (QLC) blocks.

8. A flash memory controller for accessing a flash memory module, the flash memory module being a 3D flash memory module including a plurality of flash memory chips, each flash memory chip including a plurality of blocks which include a plurality of multiple-level cell blocks, each block including a plurality of data pages and including a plurality of word lines respectively disposed on a plurality of different planes and a plurality of floating transistors controlled by a plurality of bit lines, floating transistors on each bit line forming at least one page among the plurality of data pages, and the flash memory controller comprises:
a memory, configured for storing a program code:
a microprocessor, configured for performing the program code to control access of the flash memory module; and
a codec, configured for performing encoding upon data to generate at least one set of parity check codes, wherein the data is to be programmed into a super block of the flash memory chips and the super block includes one multiple-level cell block of each flash memory chip among the flash memory chips;
wherein the microprocessor is arranged for programming the data into the super block, writing and buffering the at least one set of parity check codes into a buffer memory, reading the at least one set of parity check codes from the buffer memory, encoding the at least one set of parity check codes to generate at least one set of final parity check codes, and then programming the at least one set of final parity check codes into a plurality of data pages of one flash memory chip of the super block; each flash memory chip of the 3D NAND-type flash memory module has a plurality of 3D stacked planes; all word lines disposed on a same 3D stacked plane are classified into a same word line set all word line sets are classified into a group of multiple odd word line sets and a group of multiple even word line sets; and, the at least one set of parity check codes is generated for data disposed on particular word lines associated with a same order respectively comprised within different non-adjacent word line sets, the different non-adjacent word line sets being the multiple odd word line sets or the multiple even word line sets.

9. The flash memory controller of claim 8, wherein when error(s) occurring due to programming for the data or program fail, the codec is arranged for directly using the at least one set of parity check codes temporarily stored in the buffer memory to correct the error(s) of the data.

10. The flash memory controller of claim 8, wherein during the data being programmed into the super block: the microprocessor is arranged for reading a portion of the data, which has been written into the super block, from the super block, and reading at least one portion of parity check codes from the buffer memory; and the codec is arranged for using the at least one portion of parity check codes to perform error correction upon the portion of the data when an error occurs and cannot corrected during reading the portion of the data.

11. The flash memory controller of claim 8, wherein the codec is arranged for sequentially performing encoding upon first to N-th data units to generate first to N-th sets of parity check codes, and respectively programming the first to N-th data units into first data pages to N-th data pages corresponding to the flash memory chips of the super block; and the microprocessor is arranged for programming the first to N-th sets of parity check codes into the buffer memory.

12. The flash memory controller of claim 11, wherein the at least one set of parity check codes is a at least one set of temporary parity check codes, and the microprocessor is arranged for reading the first to N-th sets of parity check codes to generate multiple sets of final parity check codes according to the first to N-th sets of parity check codes, and programming the multiple sets of final parity check codes into the super block.

13. The flash memory controller of claim 12, wherein multiple word lines positioned on a same plane of each block forms a word line set, and the microprocessor is arranged for programming the multiple sets of final parity check codes into data pages of a flash memory chip corresponding to last two word line sets of the super block.

14. The flash memory controller of claim 8, wherein the multiple-level cell blocks are TLC blocks or QLC blocks.

15. A memory device, comprising:
a flash memory module being a 3D flash memory module including a plurality of flash memory chips, each flash memory chip including a plurality of blocks which include a plurality of multiple-level cell blocks, each block including a plurality of data pages and including a plurality of word lines respectively disposed on a plurality of different planes and a plurality of floating transistors controlled by a plurality of bit lines, floating transistors on each bit line forming at least one page among the plurality of data pages; and
a flash memory controller, configured for accessing the flash memory module;
wherein when receiving a programming/writing instruction from a host device to program data into the flash memory module, the flash memory controller is arranged for: performing encoding upon data to generate at least one set of parity check codes wherein the data is to be programmed into a super block of the flash memory chips and the super block includes one multiple-level cell block of each flash memory chip among the flash memory chips, for programming the data into the super block, for writing and buffering the at least one set of parity check codes into a buffer memory, for reading the at least one set of parity check codes from the buffer memory, encoding the at least one set of parity check codes to generate at least one set of final parity check codes, and then for programming the at least one set of final parity check codes into a plurality of data pages of one flash memory chip of the super block; each flash memory chip of the 3D NAND-type flash memory module has a plurality of 3D stacked planes; all word lines disposed on a same 3D stacked plane are classified into a same word line set all word line sets are classified into a group of multiple odd word line sets and a group of multiple even word line sets; and, the at least one set of parity check codes is generated for data disposed on particular word lines associated with a same order respectively comprised within different non-adjacent word line sets, the different non-adjacent word line sets being the multiple odd word line sets or the multiple even word line sets.

* * * * *